United States Patent [19]

Takahashi et al.

[11] Patent Number: 5,309,632
[45] Date of Patent: May 10, 1994

[54] PROCESS FOR PRODUCING PRINTED WIRING BOARD

[75] Inventors: Hiroshi Takahashi, Kasama; Shin Takanezawa, Shimodate; Masao Kanno, Shimodate; Yorio Iwasaki, Shimodate; Toshirou Okamura, Shimodate; Akishi Nakaso, Oyama; Kiyoshi Hasegawa, Yuki, all of Japan

[73] Assignee: Hitachi Chemical Co., Ltd., Tokyo, Japan

[21] Appl. No.: 970,925

[22] Filed: Nov. 2, 1992

Related U.S. Application Data

[63] Continuation-in-part of Ser. No. 327,593, Mar. 23, 1989, abandoned.

[30] Foreign Application Priority Data

| Mar. 28, 1988 | [JP] | Japan | 63-74119 |
| Mar. 31, 1988 | [JP] | Japan | 63-78383 |
| Apr. 5, 1988 | [JP] | Japan | 63-83384 |
| Jul. 26, 1988 | [JP] | Japan | 63-185755 |

[51] Int. Cl.$^5$ .............................. H01K 3/10
[52] U.S. Cl. ......................... 29/852; 29/846; 174/266; 427/306
[58] Field of Search ............. 427/306, 305; 29/852, 29/846; 156/656; 174/259, 266

[56] References Cited

U.S. PATENT DOCUMENTS

| 3,154,478 | 10/1964 | Lee | 29/846 X |
| 3,322,881 | 5/1967 | Schneble, Jr. et al. | 174/266 |
| 3,606,677 | 9/1971 | Ryan | 29/846 X |
| 3,672,986 | 6/1972 | Schneble, Jr. et al. | 174/259 |
| 4,136,216 | 1/1979 | Feldstein | 427/306 X |
| 4,512,829 | 4/1985 | Ohta et al. | 427/306 X |
| 4,572,925 | 2/1986 | Scarlett | 29/846 X |

FOREIGN PATENT DOCUMENTS

56-47716 11/1981 Japan .
58-42233 3/1983 Japan .

OTHER PUBLICATIONS

RCA Notes Tech Notes Apr. 1968 by Robert J. Ryan.

*Primary Examiner*—Carl J. Arbes
*Attorney, Agent, or Firm*—Antonelli, Terry, Stout & Kraus

[57] ABSTRACT

A process for producing a printed wiring board characterized by forming a nickel layer by electroless plating and a copper layer formed thereon by electroless plating, or forming a copper undercoating layer before the nickel layer by electroless plating can produce printed circuit boards excellent in resistance to electrolytic corrosion and suitable for mounting parts in high density.

9 Claims, 4 Drawing Sheets

PROCESS FOR PRODUCING PRINTED WIRING BOARD

This is a continuation-in-part application of application Ser. No. 327,593, filed on Mar. 23, 1989 now abandoned.

BACKGROUND OF THE INVENTION

This invention relates to a process for producing a high density printed wiring board by an additive process.

Printed wiring boards are generally produced economically by an additive process wherein necessary wiring conductors are formed by electroless plating. According to the additive process, necessary wiring patterns are formed by forming adhesive layers having thereon an electroless plating catalyst such as palladium on surfaces of an insulating substrate having the same catalyst for electroless plating, masking portions other than circuit forming portions with a plating resist selectively roughening an adhesive surface to be formed into circuit portions with a chemical solution such as chromic acid, or the like, neutralizing and washing with water, and forming conductors on circuit portions by electroless copper plating.

With a recent demand for miniaturizing and light weighting electronic devices, printed wiring boards with high density have also been demanded, resulting in narrowing distances between through-holes and between wiring conductors. As a result, by an electric field formed between neighboring wiring conductors or conductors of inner walls of through-holes, various treating solutions retained in surface or inner portions of the insulating substrate supporting the conductors are activated to easily bring about electrolytic corrosion which accelerate migration of conductors. Thus, it is impossible to make the distance between conductors 0.15 mm or less. Further, it is also impossible to narrow the distances between through-holes, so that in order to obtain high density wiring, only the width of conductors should be reduced, resulting in producing a limit to the wiring density. As a cause for bringing about electrolytic corrosion, it is considered that migration of copper is brought about by ionic impurities contained in additive layers formed on the insulating substrate or a residue of a special treating solution used in the additive process when an electric field is applied between wiring conductors under a high temperature and high humidity.

In order to solve the problem of electrolytic corrosion, it is proposed a process comprising conducting electroless nickel plating on whole surfaces of an insulating substrate having adhesive layers thereon and through holes therein, forming a plating resist on portions other than circuit portions, electroplating copper on the circuit portions, peeling the resist, and removing nickel on non-circuit portions with an ammonium persulfate solution containing benzotriazole (Japanese Patent Examined Publication No. 56-47716). This process is illustrated by FIGS. 3(a) to 3(h) wherein numeral 11 denotes an insulating substrate, numeral 12 denotes an adhesive layer, numeral 13 denotes a through-hole, numeral 14 denotes a nickel plated layer, numeral 15 denotes a plating resist, numeral 16 denotes a copper plated layer, and numeral 17 denotes a printed wiring board after removing the nickel layer. But according to this process, since circuit conductors are formed by electroplating of copper on the whole surface of electroless plated nickel, there arise various problems in that the plating thickness in the through-holes obtained by electroplating of copper is not uniform, high density of wiring is difficult due to no room for changing hole diameters at the time of planing or due to no surface smoothness of conductors necessary for mounting various parts thereon, and the like.

SUMMARY OF THE INVENTION

It is an object of the present invention to provide a process for producing a printed wiring board provide a process for producing with high density and excellent in resistance to plating electrolytic corrosion as well as excellent in plating processability, The present invention provides a process for producing a printed wiring board by an additive process characterized by forming a layer of metal such as nickel which is slight in migration by and electric field by electroless plating on an insulating substrate, and forming a metallic conductor having electric conductivity such as copper thereon by electroless plating.

The present invention also provide a process for producing a printed wiring board by an additive process characterized by forming a thin layer of copper on an insulating substrate, forming a layer of metal such as nickel which is slight in migration by an electric field by electroless plating on the copper thin layer, and forming a metallic conductor having electric conductivity such as copper thereon by electroless plating.

DESCRIPTION OF THE PREFERRED EMBODIMENTS

The process of the present invention includes (I) a process comprising a step of forming a metallic layer of Ni, Ni alloy, Co, Co alloy, Pd or Ag on an insulating substrate, and a step of forming an electric conductive metallic layer such as copper thereon, and (II) a process comprising a step of forming a thin layer of copper on an insulating substrate, a step of forming a layer of metal such as nickel which is slight in migration by an electric field by electroless plating on the copper thin layer, and forming a metallic conductor having electric conductivity such as copper thereon by electroless plating.

Figure 1A:
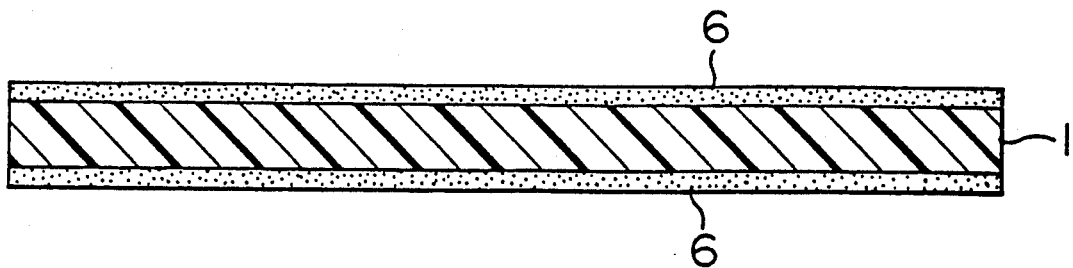
FIGS. 1(a) to 1(f) are cross-sectional views explaining one embodiment of the process of the present invention.
Figure 1B:
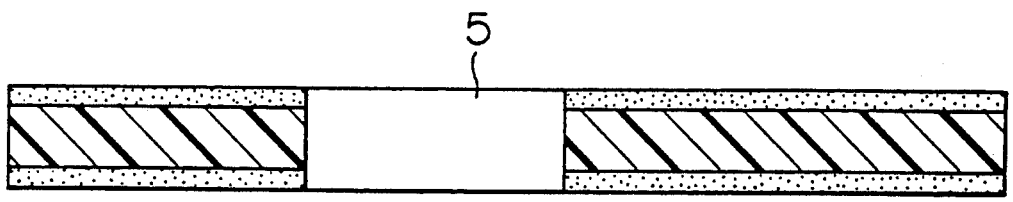
Figure 1C:
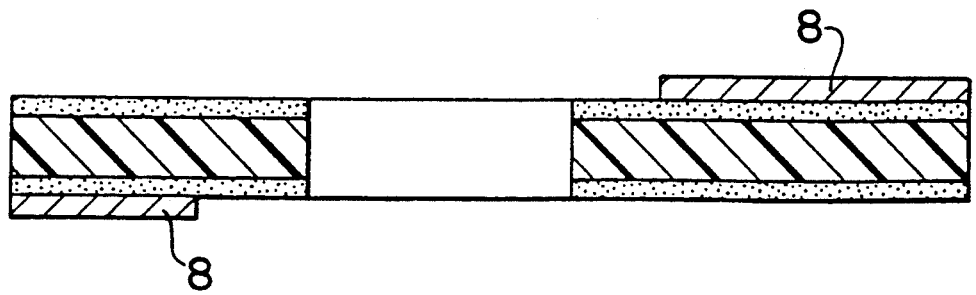
Figure 1D:
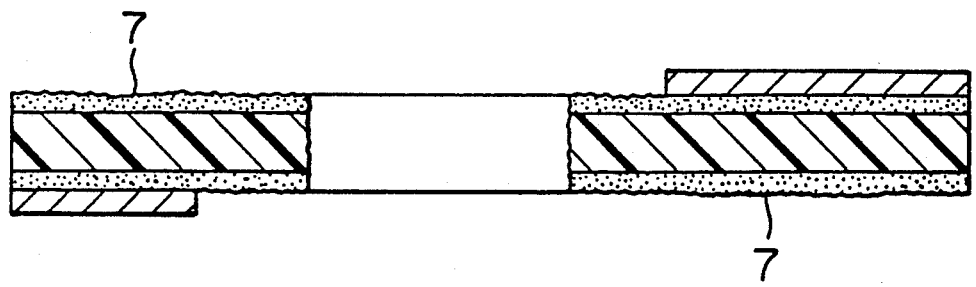
Figure 1E:
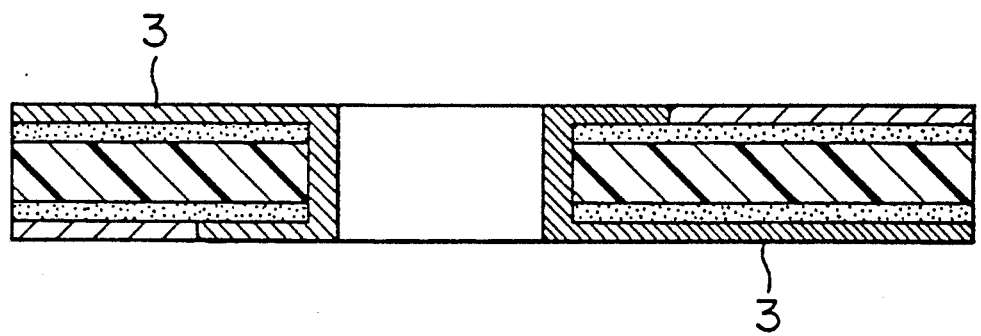
Figure 1F:
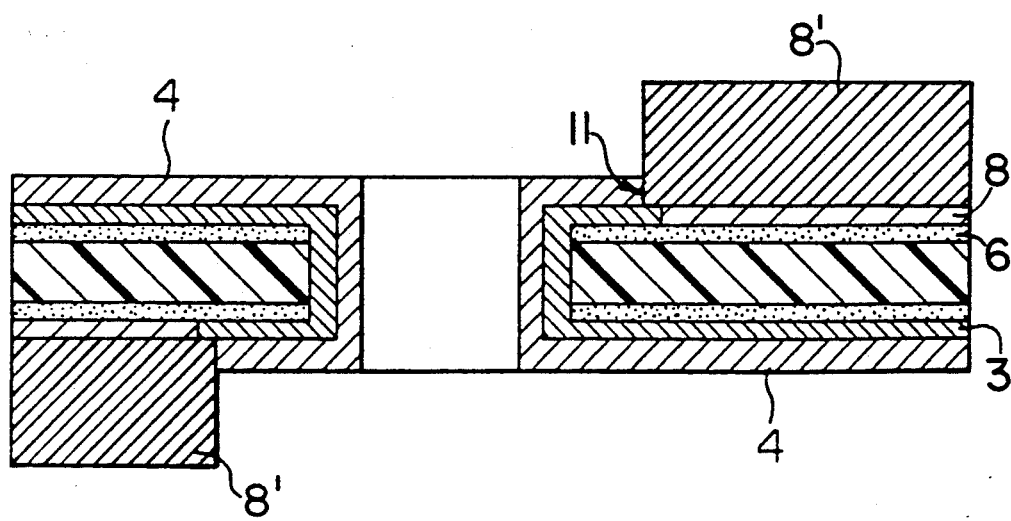

More concretely, the process (I) fundamentally comprises (with referring to FIGS. 1(a) to 1(g)):

(i-a) forming an adhesive layer containing an electroless plating catalyst on surfaces of an insulating substrate containing an electroless plating catalyst (FIG. 1(a)), (ii-b) drilling through-holes in the resulting insulating substrate (FIG. 1(b)), (iii-c) masking portions except for the through-holes and circuit forming portions and markings with a first resist for electroless plating (FIG. 1(c)), (iv-d) dipping the resulting substrate in a chemical roughening solution to selectively roughen the portions not masked with the resist (FIG. 1(d)), (v-e) dipping the thus treated substrate in an electroless nickel plating solution to form nickel plated layers on the roughened portions not masked with the first resist (FIG. 1(e)), (v-ef) masking portions except for the through-holes and circuit forming portions with a second resist for electroless plating, the second resist forming a circuit forming pattern on the nickel plated layers that is 5 to 10 μm narrower than the the pattern of the first resist so that the second resist covers a portion of the nickel plated layers, as shown in FIG. 1(f), and (vi-f) dipping the nickel plated substrate in an electroless copper plating solution to conduct copper plating on the nickel plated layers (FIG. 1(f)).

In FIGS. 1(a) to 1(f), numeral 1 denotes an insulating substrate, numeral 6 denotes an adhesive layer, numeral 5 denotes a through-hole, numeral 8 denotes a first plating resist, numeral 8' denotes a second plating resist, numeral 7 denotes a chemically roughened surface, numeral 3 denotes a nickel plated layer, numeral 4 denotes a copper plated layer.

By the step (i-a), an adhesive layer containing an electroless plating catalyst is formed on both sides of an insulating substrate containing an electroless plating catalyst. As the insulating substrate, there can be used conventionally used ones such as paper-epoxy resin laminates (e.g. LE-168, LE-144, etc. mfd. by Hitachi Chemical Co., Ltd.), paper-phenol resin laminates, glass fiber-epoxy resin laminates, glass cloth-epoxy resin laminates, glass cloth-polyimide laminates, etc.

As the electroless plating catalyst, there can be used palladium and its compounds, platinum and its compounds, rhodium and its compounds, etc. conventionally used in this art.

As the adhesive layer there can be used that containing as a major component a rubber component such as acrylonitrile-butadiene rubber (NBR), butadiene rubber, styrene-butadiene rubber (SBR), etc. added with a phenolic resin, melamine resin or an epoxy resin and an inorganic filler such as silica, zirconium silicate, etc.

In the step (i-a), the insulating substrate containing an electroless plating catalyst and the adhesive layer containing an electroless plating catalyst are used.

By the step (ii-b), through-holes are drilled in the resulting substrate.

Through-holes are formed by using an apparatus such as a punch, a drill, etc., conventionally used for drilling through-holes in wiring boards.

By the step (iii-c), portions except for the through-holes and circuit forming portions are masked with a first resist for electroless plating and, preferably, markings are provided for adjusting the position of the first resist. The markings can be made according to a conventional technique.

As the resist, there can be used an ultraviolet (UV) curing type resist film obtained by forming a light curable resin into a film followed by curing, a film obtained by, for example, screen printing a UV curable resist ink or a thermosetting resist ink, etc., followed by curing. As the material for forming the resist, there can be used conventionally used ones such as epoxy resins, acrylic resins, etc. These resists should not be peeled off during the steps of dipping in the electroless nickel plating solution the electroless copper plating solution, and other chemical solutions used for pre-treatment or after-treatment.

By the step (iv-d), the portions not masked with the resist are selectively roughened by dipping the resulting substrate in a chemical roughening solution.

As the chemical roughening solution, there can be used those conventionally used in the additive process, for example, a mixed solution of chromic acid and sulfuric acid, a mixed solution of chromic acid and borofluoric acid, etc.

By the step (v-e), nickel plated layers are formed on the roughened portions not masked with the resist by dipping the thus treated substrate in an electroless nickel plating solution.

As the electroless nickel plating solution, there can be used a conventionally used one comprising a hypophosphite as a reducing agent, phosphoric acid or boron, a nickel compound such as nickel chloride, nickel nitrate, or the like. Such a nickel plating solution can be used at a temperature of preferably 40° to 95° C. Such an electroless nickel plating solution is available commercially under trade names such as Blue Shumer (mfd. by Japan Kanigen Co., Ltd.), "Top Nimaron (mfd. by Okuno Seiyaku K.K.), Nimuden (mfd, by Uemura Kogyo K.K.).

The thickness of the nickel plated layer is preferably in the range of 0.5 to 10 μm from the viewpoint of prevention of electrolytic corrosion, uniformity in thickness of the plated layer and the thickness of finally produced wiring board.

By the step (v-ef), the portions except for the through-holes and circuit forming portions are masked with the second resist for electroless plating, said second resist being 5 to 10 μm narrower than the first resist. Further, the second resist also has markings for adjusting the position according to a conventional technique so as to prevent a shift from the first resist.

By the step (vi-f), a copper plated layer is formed on the nickel plated layer by dipping the nickel plated substrate in an electroless copper plating solution.

As the electroless copper plating solution, there can be used a conventional one comprising:

| | |
|---|---|
| $CuSO_4.5H_2O$ | 10 g/liter |
| NaCN | 15-30 mg/liter |
| formaline (36%) | 4 ml/liter |
| EDTA | 40 g/liter |
| pH | 12.5 (adjusted by NAOH) |

The electroless copper plating can be carried out preferably at 40° to 90° C. to form a copper plated film of preferably 12 to 70 μm.

In the above-mentioned process (I), an insulating substrate containing no electroless plating catalyst can be used in the step (i-a) and roughened surfaces can be selectively exposed in place of selective roughening in the step (i-d).

Such a process (I-1) comprises steps of (i-a') forming an adhesive layer on surfaces of an insulating substrate, (ii-b) drilling through-holes in the resulting insulating substrate, (iii-d') dipping the resulting substrate in a chemical roughening solution to roughen whole surfaces, (iv-c) masking portions except for the through-holes and circuit forming portions with a first resist for electroless plating, (v-e) dipping the thus treated substrate in an electroless nickel plating solution to form nickel plated layers on the roughened portions not masked with the first resist, (v-ef) masking portions except for the through-holes and circuit forming portions with a second resist for electroless plating, and the pattern of second resist is 5 to 10 μm narrower on the nickel plated layers than the first resist, and (vi-f) dipping the nickel plated substrate in an electroless copper plating solution to conduct copper plating on the nickel plated layers.

In the step (i-a'), as the insulating substrate containing no electroless plating catalyst, there can be used glass cloth-epoxy resin laminates (e.g. LE-47N, LE-61N, etc. mfd. by Hitachi Chemical Co., Ltd.).

The steps (ii-b), (iv-c), (v-e), and (vi-f) are the same as mentioned above.

The process (I) can also be modified as a process (I-2) comprising:

(i-a') forming an adhesive layer on surfaces of an insulating substrate, (ii-b) drilling through-holes in the resulting insulating substrate, (iii-c) masking portions except for the through-holes and circuit forming portions with a first resist for electroless plating, (iv-d) dipping the resulting substrate in a chemical roughening solution to selectively roughen the portions not masked with the first resist, (v-g) dipping the resulting substrate in an aqueous solution containing palladium ions, (vi-h) dipping the resulting substrate in a reducing agent solution, (vii-e') dipping the thus treated substrate in an electroless plating solution to form plated layers of nickel, a nickel alloy, cobalt, a cobalt alloy, palladium, gold or a mixture thereof on the roughened portions not masked with the first resist, (vii-ef) masking portions except for the through-holes and circuit forming portions with a second resist for electroless plating, and the second resist is 5 to 10 μm narrower than the first resist, and (viii-f) dipping the thus plated substrate in an electroless copper plating solution to conduct copper plating on the plated layers.

In this process, the steps (ii-b), (iii-c), (iv-d), (vii-ef) and (viii-f) are the same as mentioned above.

In the step (i-a'), as the insulating substrate, there can be used paper-phenol resin laminates, paper-epoxy resin laminates, glass cloth-epoxy resin laminates, glass cloth-polyimide resin laminates, etc. (e.g. LP-47F, LE-44, LE-67, LI-67, LI-68, mfd. by Hitachi chemical Co., Ltd.). These insulating substrates may includes electroless plating catalysts such as palladium, platinum, rhodium, etc. Further, the insulating substrate may includes inner circuits therein.

As the material for forming the adhesive layer, there can be used a resin composition containing NBR as a major component, a resin composition containing NBR and chlorosulfonated polyethylene as major components, a resin composition containing an epoxy resin as a major component, etc. These resin compositions nay contain one or more fillers such as zirconium silicate, silica, calcium carbonate, aluminum hydroxide, and the like. Further, these resin compositions may contain an electroless plating catalyst such as palladium, platinum, rhodium, etc.

In the step (v-g), as the aqueous solution containing palladium ions, there can be used an aqueous solution obtained by adding hydrochloric acid to Red Shumer containing palladium ions (a trade name, mfd. by Japan Kanigen Co. Ltd.) and if necessary, further adding palladium chloride as an extender, or diluting with water to adjust properly the palladium concentration, or an aqueous solution obtained by dissolving palladium chloride in hydrochloric acid with a hydrogen chloride concentration of 2 to 20% by weight. The use of an aqueous solution of palladium in a concentration of 0.01 to 0.6% by weight is preferable for making the thickness of nickel and the like plated layer uniform.

In the step (vi-h), as the reducing agent for reducing palladium, there can be used inorganic reducing agents such as a hypophosphite, a borohydride, or organic reducing agents such as amine borane, hydrazine, etc. These compounds are generally used as a reducing agent for electroless plating solutions of copper, nickel, cobalt, gold or palladium.

After the reducing agent treatment, it is preferable to conduct washing with water or an aqueous solution of hydrochloric acid.

By employing the step (v-g) and (vi-H), the following electroless nickel plating can be carried out at a lower temperature (e.g. 60°–70° C.) compared with the case of not employing the steps (v-g) and (vi-h) wherein the temperature of 90° to 95° C. is necessary.

In the step (vii-e'), a plated layer is formed by using an electroless plating solution of nickel, a nickel alloy such as Ni-W alloy, Ni-Co alloy, etc., cobalt, a cobalt alloy such as CO-W alloy, etc., palladium or gold, conventionally used in this art. More concretely, there can be used commercially available ones such as Blue Shumer (a trade name, mfd. by Japan Kanigen Co., Ltd.) which is a nickel plating solution containing a hypophosphite as a reducing agent, and phosphorus or boron, Top Nikoron (a trade name, mfd. by Okuno Seiyaku K.K.), Nimuden (a trade name, mfd. by Uemuka Kogyo K.K.), etc.

In the case of palladium or gold plated layer, the thickness of the plated layer is preferably 0.5 to 5 μm from the viewpoint of uniformity of thickness of plated layer and the thickness of finally finished wiring board. On the other hand, in the case of plated layer of other metals, the thickness of 0.5 to 10 μm is preferable by the same reasons as mentioned above.

The process (I-2) can be modified as a process (I-3) comprising (i-a) forming an adhesive layer containing an electroless plating catalyst on surfaces of an insulating substrate containing an electroless plating catalyst, (ii-b) drilling through-holes in the resulting substrate, (iii-c) masking portions except for the through-holes and circuit forming portions with a first resist for electroless plating, (iv-d) dipping the resulting substrate in a chemical roughening solution to selectively roughen the portions not masked with the first resist, (v-e') dipping the thus treated substrate in an electroless plating solution to form plated layers of nickel, a nickel alloy, cobalt, a cobalt alloy, palladium, gold or a mixture thereof on the roughened portions not masked with the first resist, (v-ef) masking portions except for the through-holes and circuit forming portions with a second resist for electroless plating, and the second resist is 5 to 10 μm narrower than the first resist, and (vi-f) dipping the thus plated substrate in an electroless copper plating solution to conduct copper plating on the plated layers.

The steps of (v-g) and (vi-h) of the process (I-2) can be omitting by changing the step ii-a') to the step (i-a).

As mentioned previously, the electrolytic corrosion is caused by ionic impurities contained in the adhesive layers formed on both sides of the insulating substrate or a residue of special treating solutions used in the additive process, when an electric field is applied between wiring conductors under high temperatures and high humidity to migrate copper. By interposing nickel, which is a substance slight in migration of components by an electric field, between copper wiring conductors and the insulating substrate, deterioration in insulating properties on the surfaces of insulating substrate due to electrolytic corrosion at the time of application of voltage can be prevented. At this time, by adsorbing and reducing palladium selectively on circuit forming portions not masked with the resist, it becomes possible to deposit nickel or the like metal in a short time. Further, since the thickness of undercoating copper plated layer is 3 $\mu$m or less, more preferably 1 $\mu$m or less, deterioration in insulating properties by electrolytic corrosion is remarkably rare. Even if electrolytic corrosion takes place, since the thickness is thin and the migrating amount of copper is small, conductors are not short-circuited each other.

Figure 2:
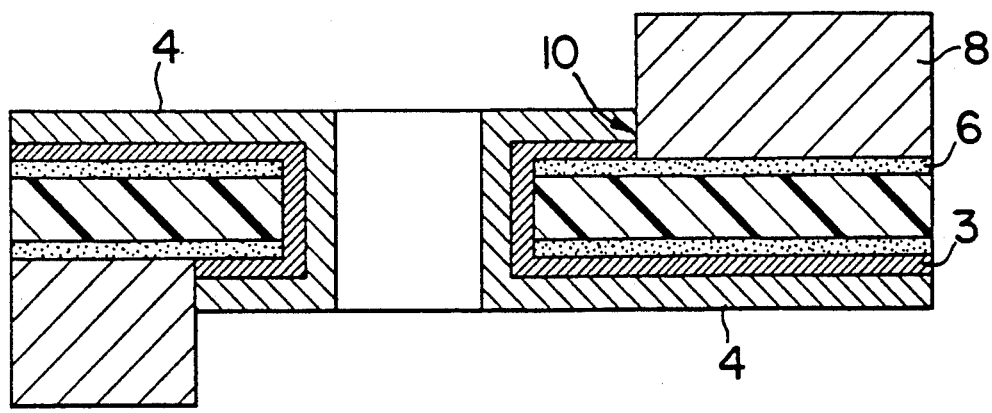
FIG. 2 is a cross-sectional view of a printed wiring board wherein only a first resist layer is used.
Figure 3A:
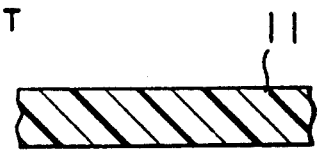
FIGS. 3(a) to 3(h) are cross-sectional views explaining a process of prior art.
Figure 3B:
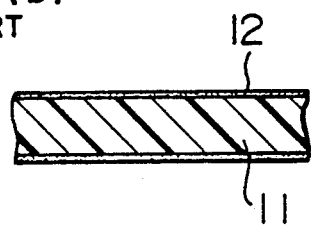
Figure 3C:
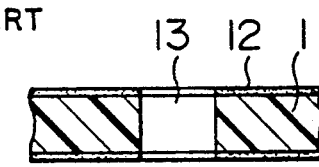
Figure 3D:
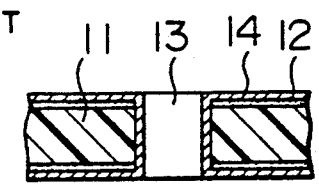
Figure 3E:
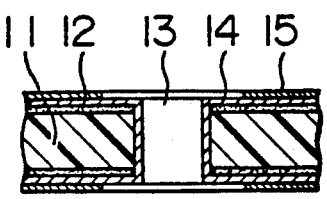
Figure 3F:
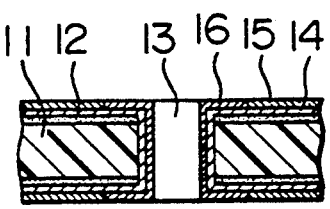
Figure 3G:
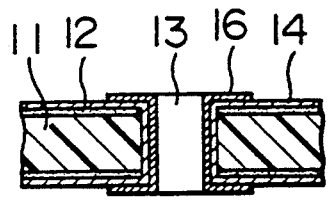
Figure 3H:
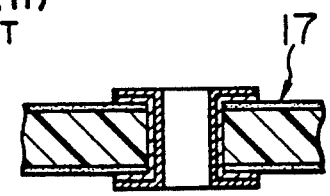

But, when a printed wiring board having the cross-sectional structure as shown in FIG. 2 is placed under severe conditions such as a humidity of 85%, a temperature of 85° C. and an application of a direct current of 100 V, electrolytic corrosion sometimes takes place. This seems to be caused by a vacant space at the boundary 10 between the nickel layer 3, the copper layer 4 and the resist layer 8 (only one resist layer is used) due to a difference of expansion rates of the resist layer 8 and the adhesive layer 6, said vacant space being filled with water, which makes the copper layer contact with the adhesive layer, resulting in causing electrolytic corrosion.

In contrast, since the printed wiring board of the present invention has the cross-sectional structure as shown in FIG. 1(f), even if a vacant space is produced at the boundary 11 between the copper layer 4 and the second resist 8' and water is filled therein, the electrolytic corrosion is completely prevented by the nickel layer 3 under the vacant space and the first resist layer 8 under the second resist layer 8'.

The present invention is illustrated by way of the following Examples, in which all percents are by weight unless otherwise specified.

EXAMPLE 1

On a paper-epoxy resin laminate (LE-144, a trade name, mfd. by Hitachi Chemical Co., Ltd.) containing palladium chloride as an electroless plating catalyst, an adhesive containing NBR as a major component, and an alkyl phenol resin, an epoxy resin, and silica and zirconium silicate as fillers and palladium chloride, dissolved in a solvent was coated, dried and cured with heating to give an insulating substrate covered with the adhesive layers.

After drilling holes at predetermined positions by a punch press, a photoresist film for electroless plating made of ultraviolet curable acrylic resin (Photec SR-3000, a trade name, mfd. by Hitachi Chemical Co., Ltd.) was laminated on the resulting substrate using a vacuum laminator, followed by exposing to light and development to form the resist on portions other than circuit forming portions.

After forming the resist, the resulting substrate was dipped in a mixed solution of chromic acid and sulfuric acid ($CrO_2$ 255 g, concentrated $H_2SO_4$ 210 ml diluted with water to make the solution 1 liter as a whole) at 40° C. for 15 minutes to selectively roughening the circuit forming portions on the adhesive layers, followed by washing with water and neutralization.

The thus roughened substrate was dipped in an electroless nickel plating solution containing a hypophosphite as a reducing agent (Blue Shumer, a trade name, mfd. by Japan Kanigen Co., Ltd.) at 90° C for 10 minutes, followed by washing with water. After electroless nickel plating, a photoresist film for electroless plating made of ultraviolet curable acrylic resin (Photec SR-3000, a trade name, mfd. by Hitachi Chemical Co., Ltd.) was laminated on the resulting substrate using a vacuum laminator, followed by exposing to light and development to form a second resist on the nickel circuit providing a pattern 5 to 10 $\mu$m narrower than that of the first resist. Then, the resulting nickel plated substrate was dipped in an electroless copper plating solution comprising:

| | |
|---|---|
| $CuSO_4.5H_2O$ | 10 g/liter |
| NaCN | 15 mg/liter |
| formaline (36%) | 4 ml/liter |
| EDTA | 40 g/liter |
| pH | 12.5 | at 70° C. to deposit copper in 70 $\mu$m thick. Then, a solder resist was screen printed on the substrate surfaces other than the through-holes, and cured with heating to give a sample of printed wiring board.

EXAMPLE 2

On a glass cloth-epoxy resin laminate containing palladium chloride, the same adhesive as used in Example 1 was coated and cured with heating to give an insulating substrate. Then, through-holes were drilled with a high speed drilling machine. A photosensitive resist film was adhered to the adhesive layers, followed by selective exposing to light and development to form a resist.

After chemically roughening the resulting substrate with the same chemical roughening solution as used in Example 1, the resulting substrate was dipped in an electroless nickel plating solution (Shumer SB-55, a trade name, mfd. by Japan Kanigen Co., Ltd.) at 90° C. for 5 minutes to deposit nickel boron. After electroless nickel plating, a photoresist film for electroless plating made of ultraviolet curable acrylic resin (Photec SR-3000, a trade name, mfd. by Hitachi Chemical Co., Ltd.) was laminated on the resulting substrate using a vacuum laminator, followed by exposing to light and development to form a second resist on the nickel circuit 5 to 10 $\mu$m narrower than the first resist. Then, the resulting substrate was dipped in the same electroless copper plating solution as used in Example 1 to deposit copper in 22 $\mu$m thick. Then, a solder resist was screen printed on the substrate surfaces other than the through-holes and cured with heating in the same manner as described in Example I to give a sample of printed wiring board.

EXAMPLE 3

On a paper-epoxy resin laminate (LE-47N, a trade name, mfd. by Hitachi Chemical Co., Ltd.), an adhesive containing NBR as a major component, an alkylphenol resin, and inorganic fillers of silica and zirconium silicate uniformly dissolved in a mixed solvent of methyl ethyl ketone and Cellosolve acetate was coated, dried and cured with heating to give an insulating substrate covered with the adhesive layers of about 30 μm thick.

After drilling holes at predetermined positions by a punch press, the resulting substrate was subjected to chemical roughening in the same manner as described in Example 1, followed by washing with water and neutralization. Then, the resulting substrate was dipped in 20% HCl for 1 minute, followed by dipping in a sensitizer HS-201B (a trade name, mfd. by Hitachi Chemical Co., Ltd.) containing palladium chloride and stannous chloride to adsorb the electroless plating catalyst. After laminating a resist film for electrolESS plating (Photec SR-3000, a trade name, mfd. by Hitachi Chemical Co., Ltd.) using a vacuum laminator, the resulting substrate was exposed to light and developed to mask non-circuit portions with the resist.

The resulting substrate was dipped in the same electroless nickel plating solution a used in Example 1 at 80° C. for 10 minutes. After electroless nickel plating, a photoresist film for electroless plating made of ultraviolet curable acrylic resin (Photec SR-3000, a trade name, mfd. by Hitachi Chemical Co., Ltd.) was laminated on the resulting substrate using a vacuum laminator, followed by exposing to light and development to form a second resist on the nickel circuit 5 to 10 μm narrower than the first resist. Then, the substrate was dipped in the same electroless copper plating solution as used in Example 1 at 70° C. to deposit a copper plated layer of 20 μm thick. Then, a solder resist was screen printed on the substrate surfaces other than the through-holes, and cured with heating to give a sample of printed wiring board.

COMPARATIVE EXAMPLE 1

The process of Example 1 was repeated excepted for not conducting the electroless nickel plating.

COMPARATIVE EXAMPLE 2

The process of Example 2 was repeated except for not conducting the electroless nickel plating.

In the above-mentioned samples, both the conductor width and the space between conductors were made 0.1 mm, the through-hole diameter was made 0.6 mm, and the number of through-holes was made 200. Conductor patterns for evaluating electrolytic corrosion were formed on both sides of insulating substrates (via through-holes) for connecting through-holes were formed.

Electrolytic corrosion (EC) between conductors was tested by placing samples under a temperature of 65° C. and relative humidity (RH) of 95%, applying a direct current of 50 V between conductors continuously, taking a part of samples after predetermined periods (100 hours and 300 hours), and measuring insulation resistance values between conductors.

Electrolytic corrosion (EC) between through-holes was tested by observing the change of cross-section of through-hole after 300 hours by the naked eye.

Solder heat resistance and peeling strength were measured according to JIS C-6481.

The results are shown in Table 1.

As is clear from Table 1, both the electrolytic corrosion between conductors and between through-holes are improved remarkably, while maintaining good solder heat resistance and peeling strength.

TABLE 1

|  | Examples | | | Comparative Examples | |
| --- | --- | --- | --- | --- | --- |
|  | 1 | 2 | 3 | 1 | 2 |
| EC between electrodes |  |  |  |  |  |
| after 100 hrs | No change in resistance value | No change in resistance value | No change in resistance value | Resistance value was reduced by 50% | No change in resistance value |
| after 300 hrs | No change in resistance value | No change in resistance value | No change in resistance value | Short-circuited | short-circuited |
| EC between through-holes after 300 hrs | No change | No change | No change | Migration of copper | Migration of copper |
| Solder heat resistance (260° C.) | ≧60 sec. | ≧60 sec. | ≧60 sec. | ≧60 sec. | ≧60 sec. |
| Peeling strength (kgf/cm) | 2.0 | 2.1 | 1.8 | 2.0 | 2.1 |

EXAMPLE 4

On a paper-epoxy resin laminate (LE-44, a trade mane, mfd. by Hitachi Chemical Co., Ltd.), a solution of adhesive containing NBS as a major component, an alkylphenol resin, an epoxy resin, and silica and zirconium silicate as fillers was coated, and cured with heating to form adhesive layers. The resulting substrate was drilled by a punch press to provide through-holes at predetermined positions. A photoresist for electroless plating (Photec SR-3000, a trade name, mfd. by Hitachi Chemical Co., Ltd.) was laminated on the resulting substrate using a vacuum laminator, followed by exposure to light and development to form a plating resist on non-circuit portions.

Then, the resulting substrate was dipped in a mixed solution of $CrO_2$ (55 g/liter) and concentrated $H_2SO_4$ (210 ml) diluted with water to make a total volume 1 liter at 40° C. for 15 minutes to chemically roughen circuit portions, followed by neutralization and washing with water.

The resulting substrate was dipped in an aqueous solution of 200 ml of Red Shumer (a trade name, mfd. by Japan Kanigen Co., Ltd.) and 100 ml of 35N HCl at room temperature for 15 minutes, washed with water, dipped in an aqueous solution of sodium hypophosphite (60 g/liter) at 50° C. for 15 minutes, and washed with water.

The resulting substrate was dipped in an electroless nickel plating solution containing sodium hypophosphite as a reducing agent (Blue Shumer, a trade name, mfd. by Japan Kanigen Co., Ltd.) at 90° C. for 20 minutes to form nickel plating layers of about 2 μm thick. After electroless nickel plating, a photoresist film for electroless plating made of ultraviolet curable acrylic resin (Photec SR-3000, a trade name, mfd. by Hitachi Chemical Co., Ltd.) was laminated on the resulting substrate using a vacuum laminator, followed by exposing to light and development to form a second resist on the nickel circuit 5 to 10 μm narrower than the first resist. Then, the substrate was dipped in the same electroless copper plating solution as used Ln Example 1 at 70° C. to form copper plating layers of 25 μm thick on the nickel plating layers.

A solder resist was screen printed on both sides of the substrate other than the through-holes, and cured with heating to give a sample of printed wiring board.

EXAMPLE 5

On a glass cloth-epoxy resin laminate (LE-67, a trade name, mfd. by Hitachi Chemical Co., Ltd.), the same adhesive as used in Example 4 was coated and cured with heating. Through-holes were drilled in the substrate using a high speed drilling machine at predetermined positions and a plating resist was formed on the substrate in the same manner as described in Example 4. Chemical roughening was conducted in the same manner as described in Example 4.

The resulting insulating substrate was dipped in an aqueous solution of palladium chloride (5 g/liter) and 35N HCl (200 ml/liter) at room temperature for 15 minutes, washed with water, dipped in an aqueous solution of sodium borohydride (3 g/liter) at 50° C. for 10 minutes, and washed with water.

The resulting insulating substrate was dipped in an electroless nickel/tungsten alloy plating solution comprising:

| | |
|---|---|
| nickel sulfate | 7 g/liter |
| sodium tungstate | 35 g/liter |
| sodium citrate | 20 g/liter |
| sodium hypophosphite | 10 g/liter | with pH 9.8 at 93° C. for 40 minutes to form an alloy plated layer of about 2 μm thick. After electroless nickel plating, a photoresist film for electroless plating made of ultraviolet curable acrylic resin (Photec SR-3000, a trade name, mfd. by Hitachi Chemical Co., Ltd.) was laminated on the resulting substrate using a vacuum laminator, followed by exposing to light and development to form a second resist on the nickel circuit having a pattern 5 to 10 μm narrower than that of the first resist.

Electroless copper plating and formation of solder resist were carried out in the same manner as described in Example 4 to give a sample of printed wiring board.

EXAMPLE 6

On a glass cloth-epoxy resin laminate containing palladium chloride (LE-168, a trade name, mfd. by Hitachi Chemical Co., Ltd.), adhesive layers were formed in the same manner as described in Example 4.

Formation of through-holes, chemical roughening and pre-treatment for plating were carried cut in the same manner as described in Example 4.

The resulting insulating substrate was dipped in an electroless nickel/cobalt alloy plating solution comprising:

| | |
|---|---|
| nickel sulfate | 30 g/liter |
| cobalt sulfate | 30 g/liter |
| sodium glycolate | 100 g/liter |
| sodium hypophosphite | 22 g/liter | with pH 4.5–5.0 at 92° C. for 40 minutes to form an alloy plated layer of about 10 μm thick. After electroless nickel plating, a photoresist film for electroless plating made of ultraviolet curable acrylic resin (Photec SR-3000, a trade name, mfd. by Hitachi Chemical Co., Ltd.) was laminated on the resulting substrate using a vacuum laminator, followed by exposing to light and development to form a second resist on the nickel circuit 5 to 10 μm narrower than the first resist.

Electroless copper plating and formation of solder resist were carried out in the same manner as described in Example 4 to give a sample of printed wiring board.

EXAMPLE 7

On the same substrate as used in Example 5, adhesive layers were formed in the same mannar as described in Example 5.

The resulting substrate was dipped in an aqueous solution containing palladium chloriie (5 g/liter), 35N HCl (200 ml/liter) and dimethylformamide (DMF) (5 ml/liter) for 10 minutes, washed with water, dipped in an aqueous solution of dimethylamino borane (5 g/liter) at 50° C. for 10 minutes), and washed with water.

Then, the resulting substrate was dipped in an electroless cobalt plating solution comprising:

| | |
|---|---|
| cobalt chloride | 35 g/liter |
| sodium citrate | 116 g/liter |
| sodium hypophosphite | 10 g/liter | with pH 9.0 at 90° C. for 60 minutes to form a plated layer of about 6 μm thick. After electroless nickel plating, a photoresist film for electroless plating made of ultraviolet curable acrylic resin (Photec SR-3000, a trade name, mfd. by Hitachi Chemical Co., Ltd.) was laminated on the resulting substrate using a vacuum laminator, followed by exposing to light and development to form a second resist on the nickel circuit 5 to 10 μm narrower than the first resist.

Electroless copper plating and formation of solder resist were carried out in the same manner as described in Example 4 to give a sample of printed wiring board.

EXAMPLE 8

On the same insulating substrate as used in Example 7, the formation of adhesive layers, formation of plating resist layers, chemical roughening and plating pre-treatment were carried out in the same manner as described in Example 5.

The resulting substrate was dipped in an electroless palladium plating solution comprising:

| | |
|---|---|
| tetramine palladium chloride | 7.5 g/liter |
| EDTA-2Na | 8.0 g/liter |
| ammonia water | 280 g/liter |
| hydrazine (1 mole/liter) | 8 ml/liter | at 38° C. for 60 minutes to form a plated layer of about 1 μm thick. After electroless nickel plating, a photoresist film for electroless plating made of ultraviolet curable acrylic resin (Photec SR-3000, a trade name, mfd. by Hitachi Chemical Co., Ltd.) was laminated on the resulting substrate using a vacuum laminator, followed by exposing to light and development to form a second resist on the nickel circuit 5 to 10 μm narrower than the first resist.

Electroless copper plating and formation of solder resist were carried out in the same manner as described in Example 4 to give a sample of printed wiring board.

EXAMPLE 9

Using the same insulating substrate as used in Example 4, the formation of adhesive layers and plating resist layers, chemical roughening and plating pre-treatment were carried out in the same manner as described in Example 4.

The resulting substrate was dipped in an electroless gold plating solution comprising:

| potassium cyanoaurate | 2 g/liter |
| ammonium chloride | 75 g/liter |
| sodium citrate | 50 g/liter |
| sodium hypophosphite | 10 g/liter | with pH 7.0-7.5 at 92° C. for 30 minutes to form a plated layer of about 0.5 μm thick. After electroless nickel plating, a photoresist film for electroless plating made of ultraviolet curable acrylic resin (Photec SR-3000, a trade name, mfd. by Hitachi Chemical Co., Ltd.) was laminated on the resulting substrate using a vacuum laminator, followed by exposing to light and development to form a second resist on the nickel circuit 5 to 10 μm narrower than the first resist.

Electroless copper plating and formation of solder resist were carried out in the same manner as described in Example 4 to give a sample of printed wiring board.

EXAMPLE 10

On a paper-epoxy resin laminate containing palladium chloride as an electroless plating catalyst (LE-144, a trade name, mfd. by Hitachi Chemical Co., Ltd.), the same adhesive as used in Example 4 was coated, and cured with heating to provide an insulating substrate covered with adhesive layers.

Drilling of through-holes, formation of a plating resist and chemical roughening were conducted in the same manner as described in Example 4.

The resulting substrate was dipped in an aqueous solution containing 0.2 g of palladium chloride, 100 ml of 35N HCl and 1000 ml of water at room temperature for 5 minutes to adsorb the palladium chloride selectively on the roughened surfaces. After washing with water, the substrate was dipped in a 10% aqueous solution of sodium hypophosphite (a reducing solution) at 60° C. for 3 minutes for activation.

Then, the resulting substrate was dipped in an electroless nickel plating solution (Blue Shumer, a trade name, mfd. by Japan Kanigen Co., Ltd.) at 60° C. for 10 minutes to form nickel plated layers of about 4 μm thick. After electroless nickel plating, a photoresist film for electroless plating made of ultraviolet curable acrylic resin (Photec SR-3000, a trade name, mfd. by Hitachi Chemical Co., Ltd.) was laminated on the resulting substrate using a vacuum laminator, followed by exposing to light and development to form a second resist on the nickel circuit 5 to 10 μm narrower than the first resist.

Electroless copper plating and formation of solder resist were carried out in the same manner as described in Example 4 to give a sample of printed wiring board.

EXAMPLE 11

On the same glass cloth-epoxy resin laminate as used in Example 5, the same adhesive as used in Example 4 was coated and cured with heating to give an insulating substrate covered with adhesive layers.

Then, through-holes were drilled in the substrate using a high speed drilling machina. Photosensitive resist films were adhered to both sides of the substrate, selectively exposed to light and developed to form plating resists.

After chemically roughening in the same manner as described in Example 4, the substrate was dipped in an aqueous solution containing 200 ml of Red Shumer containing palladium ions (a trade name, mfd. by Japan Kanigen Co., Ltd.), 100 ml of 35N HCl, and 800) ml of water (Pd concentration: about 0.01%) at room temperature for 3 minutes, washed with water, and dipped in an aqueous ammonium solution of 0.5% by dimethyl aminoborane (a reducing solution) at 50° C. for 3 minutes for activation. After repeating this step twice, an electroless nickel plating was carried out by dipping the substrate in an electroless nickel plating solution (Shumer SB-55, a trade name, mfd. by Japan Kanigen Co., Ltd.) at 60° C. for 5 minutes to form a nickel plated layer of about 3 μm thick. After electroless nickel plating, a photoresist film for electroless plating made of ultraviolet curable acrylic resin (Photec SR-3000, a trade name, mfd. by Hitachi Chemical Co., Ltd.) was laminated on the resulting substrate using a vacuum laminator, followed by exposing to light and development to form a second resist o the nickel circuit 5 to 10 μm narrower than the first resist.

Electroless copper plating and formation of solder resist were carried out in the same manner as described in Example 4 to give a sample of printed wiring board.

COMPARATIVE EXAMPLE 3

The process of Example 4 was repeated except for not conducting electroless nickel plating to give a sample of printed wiring board.

COMPARATIVE EXAMPLE 4

The process of Example 5 was repeated except for not conducting electroless nickel/tungsten alloy plating to give a sample of printed wiring hoard.

COMPARATIVE EXAMPLE 5

The process of Example 10 was repeated except for not conducting electroless nickel plating to give a sample of printed wiring board.

COMPARATIVE EXAMPLE 6

The process of Example 11 was repeated except for not conducting electroless nickel plating to give a sample of printed wiring board.

COMPARATIVE EXAMPLE 7

The process of Example 10 was repeated except that the electroless nickel-plating was conducted without dipping in the aqueous solution containing palladium ions. In this case, no uniform plated layer was formed on the circuit portions even if the nickel plating was conducted at the solution temperature of 60° C. for 60 minutes.

COMPARATIVE EXAMPLE 8

The process of Example 11 was repeated except that the electroless nickel plating was conducted without dipping in the aqueous solution containing palladium ions. In this case, no plated layer was formed on the circuit portions even if the nickel plating was conducted at the solution temperature of 60° C. for 60 minutes.

In the above-mentioned samples of Examples 4 to 11 and Comparative Examples 3 to 8, both the conductor width and the space between conductors were made 0.1 mm, the through-hole diameter was made 0.6 mm, and the number of through-holes was made 200. Conductor patterns were made in the same manner as described in Examples 1 to 3.

Electrolytic corrosion (EC) between conductors, and between through-holes (generation of dendrite), solder heat resistance and peeling strength were measured in the same manner as described in Examples 1 to 3. The results are shown in Table 2.

As is clear from Table 2, both the electrolytic corrosion between conductors and between through-holes are improved remarkably, while maintaining good solder heat resistance and peeling-strength. Further the nickel plating can be carried out at not so high temperatures.

After drilling through-holes at predetermined positions using a punch press, the resulting substrate was laminated with a photoresist film for electroless plating (Photec SR-3000) using a vacuum laminator, exposed to light on non-circuit portions, and developed to remove non-exposed portions to form a resist. The circuit width and the space between conductors were 0.15 mm, respectively.

The resist formed substrate was dipped in a solution containing 55 g of $CrO_2$ and 210 ml cf concentrated $H_2SO_4$ and diluted with water to make a total volume 1 liter at 55° C. for 10 minutes to chemically roughen circuit forming portions selectively, followed by washing with water and neutralization.

The resulting substrate was dipped in an electroless nickel/tungsten alloy plating solution comprising:

| | |
|---|---|
| nickel sulfate | 7 g/liter |
| sodium tungstate | 35 g/liter |
| sodium citrate | 20 g/liter |
| sodium hypophosphite | 10 g/liter | with pH 9.8 at 93° C. for 60 minutes to form alloy plated layers of about 2 μm thick. After electroless nickel plating, a photoresist film for electroless plating made of ultraviolet curable acrylic resin (Photec SR-3000, a trade name, mfd. by Hitachi Chemical Co., Ltd.) was laminated on the resulting substrate using a vacuum laminator, followed by exposing to light and development to form a second resist on the nickel circuit 5 to 10

TABLE 2

| | Examples | | | | | | | |
|---|---|---|---|---|---|---|---|---|
| | 4 | 5 | 6 | 7 | 8 | 9 | 10 | 11 |
| EC between electrodes | | | | | | | | |
| after 100 hrs | No change | No change | No change | No change | No change | No change | No change | No change |
| after 300 hrs | No change | No change | No change | No change | No change | No change | No change | No change |
| EC between through-holes after 300 hrs | No change | No change | No change | No change | No change | No change | No change | No change |
| Solder heat resistance (260° C.) | ≧60 sec. | ≧60 sec. | ≧60 sec. | ≧60 sec. | ≧60 sec. | ≧60 sec. | ≧60 sec. | ≧60 sec. |
| Peeling strength (kgf/cm) | 2.1 | 2.1 | 2.1 | 2.1 | 1.8 | 1.9 | 2.1 | 2.1 |

| | | Comparative Examples | | | | |
|---|---|---|---|---|---|---|
| | | 3 | 4 | 5 | 6 | 7 8 |
| | EC between electrodes | | | | | |
| | after 100 hrs | Resistance value was reduced by 50% | No change | Resistance value was reduced by 50% | No change | — — |
| | after 300 hrs | Short-circuited | Short-circuited | Short-circuited | Short-circuited | |
| | EC between through-holes after 300 hrs | Migration of copper | Migration of copper | Migration of copper | Migration of copper | — — |
| | Solder heat resistance (260° C.) | ≧60 sec. | ≧60 sec. | ≧60 sec. | ≧60 sec. | — — |
| | Peeling strength (kgf/cm) | 2.0 | 2.1 | 1.8 | 1.9 | — — |

EXAMPLE 12

On a glass cloth-epoxy resin laminate containing palladium chloride as an electroless plating catalyst (LE-144, a trade name, mfd. by Hitachi Chemical Co., Ltd.), a solution of adhesive containing NBR as a major component, an alkylphenol resin, an epoxy resin, silica, zirconium silicate as inorganic fillers, and palladium chloride was coated and cured with heating to form adhesive layers.

μm narrower than the first resist.

After washing with water, the substrate was dipped in the same electroless copper plating solution as used in Example 1 at 70° C. to form copper plated layers of about 20 μm thick. A solder resist was screen printed on both surfaces of the substrate except for the through-holes and cured with heating to give a sample of printed wiring board.

EXAMPLE 13

On a glass cloth-epoxy resin laminate containing palladium chloride (LE-168, a trade name, mfd. by Hitachi Chemical Co., Ltd.), the same adhesive as used in Example 12 was coated and cured with heating to form adhesive layers.

After drilling through-holes at predetermined positions using a high speed drilling machine, the substrate was laminated with a photoresist film for electroless plating (Photec SR-3000) using a vacuum laminator, exposed to light and developed to form resists on non-circuit portions.

The resist formed substrate was dipped in a solution containing 55 g of $CrO_2$ and 210 mL of concentrated $H_2SO_4$ and diluted with water so as to make a total volume 1 liter at 55° C. for 10 minutes to chemically roughen circuit forming portions selectively, followed by washing with water and neutralization.

Then, the resulting substrate was dipped in an electroless cobalt/nickel alloy plating solution comprising

| | |
|---|---|
| cobalt chloride | 30 g/liter |
| nickel chloride | 30 g/liter |
| sodium glycolate | 100 g/liter |
| sodium hypophosphite | 22 g/liter | with pH 4.5–5.0 at 92° C. for 50 minutes to form alloy plated layers of about 10 μm thick. After electroless nickel plating, a photoresist film for electroless plating made of ultraviolet curable acrylic resin (Photec SR-3000, a trade name, mfd. by Hitachi Chemical Co., Ltd.) was laminated on the resulting substrate using a vacuum laminator, followed by exposing to light and development to form a second resist on the nickel circuit 5 to 10 μm narrower than the first resist.

After washing with water, the substrate was dipped in the same electroless copper plating solution as used in Example 1 at 70° C. to form copper plated layers of about 20 μm thick on the alloy plated layers. A solder resist was screen printed on both surfaces of the resulting substrate except for the through-holes and cured with heating to give a sample of printed wiring board.

EXAMPLE 14

On a glass cloth-epoxy resin laminate containing palladium chloride (LE-168), the same adhesive as used in Example 12 was coated and cured with heating to form adhesive layers.

After drilling through-holes at predetermined positions using a high speed drilling machine, the substrate was laminated with a photoresist film for electroless plating (Photec SR-3000) using a vacuum laminator, exposed to light and developed to form resists on non-circuit portions.

The resist formed substrate was dipped in a solution containing 55 g of $CrO_2$ and 210 mL of concentrated $H_2SO_4$ and diluted with water so as to make a total volume 1 liter at 55° C. for 10 minutes to chemically roughen circuit forming portions selectively, followed by washing with water and neutralization.

Then, the resulting substrate was dipped in an electroless cobalt plating solution comprising

| | |
|---|---|
| cobalt chloride | 35 g/liter |
| sodium citrate | 116 g/liter |
| sodium hypophosphite | 11.5 g/liter | with pH 8.0–10.0 at 90° C. for 60 minutes to form cobalt plated layers of about 5 μm thick. After electroless nickel plating, a photoresist film for electroless plating made of ultraviolet curable acrylic resin (Photec SR-3000, a trade name, mfd. by Hitachi Chemical Co., Ltd.) was laminated on the resulting substrate using a vacuum laminator, followed by exposing to light and development to form a second resist on the nickel circuit 5 to 10 μm narrower than the first resist.

After washing with water, the substrate was dipped in the same electroless copper plating solution as used in Example 1 at 70° C. to form copper plated layers of about 20 μm thick on the cobalt plated layers. A solder resist was screen printed on both surfaces of the resulting substrate except for the through-holes and cured with heating to give a sample of printed wiring board.

EXAMPLE 15

On a glass cloth-epoxy resin laminate containing palladium chloride (LE-168), the same adhesive as used in Example 12 was coated and cured with heating to form adhesive layers.

After drilling through-holes at predetermined positions using a high speed drilling machine, the substrate was laminated with a photoresist film for electroless plating (Photec SR-3000) using a vacuum laminator, exposed to light and developed to form resists on non-circuit portions.

The resist formed substrate was dipped in a solution containing 55 g of $CrO_2$ and 210 ml of concentrated $H_2SO_4$ and diluted with water so as to make a total volume 1 liter at 55° C. for 10 minutes to chemically roughen circuit forming portions selectively, followed by washing with water and neutralization.

Then, the resulting substrate was dipped in an electroless palladium plating solution comprising

| | |
|---|---|
| tetramine palladium chloride | 7.5 g/liter |
| EDTA-2Na | 8.0 g/liter |
| ammonia water | 280 g/liter |
| hydrazine (1 mole/liter) | 8 ml/liter | at 38° C. for 60 minutes to form palladium plated layers of about 1 μm thick. After electroless nickel plating, a photoresist film for electroless plating made of ultraviolet curable acrylic resin (Photec SR-3000, a trade name, mfd. by Hitachi Chemical Co., Ltd.) was laminated on the resulting substrate using a vacuum laminator, followed by exposing to light and development to form a second resist on the nickel circuit 5 to 10 μm narrower than the first resist.

After washing with water, the substrate was dipped in the same electroless copper plating solution as used in Example 1 at 70° C. to form copper plated layers of about 20 μm thick on the palladium plated layers. A solder resist was screen printed on both surfaces of the resulting substrate except for the through-holes and cured with heating to give a sample of printed wiring board.

EXAMPLE 16

On a glass cloth-epoxy resin laminate containing palladium chloride (LE-168), the same adhesive as used in Example 12 was coated and cured with heating to form adhesive layers.

After drilling through-holes at predetermined positions using a high speed drilling machine, the substrate was laminated with a photoresist film for electroless plating (Photec SR-3000) using a vacuum laminator, exposed to light and developed to form resists on non-circuit portions.

The resist formed substrate was dipped in a solution containing 55 g of $CrO_2$ and 210 ml of concentrated $H_2SO_4$ and diluted with water so as to make a total volume 1 liter at 55° C. for 10 minutes to chemically roughen circuit forming portions selectively, followed by washing with water and neutralization.

Then, the resulting substrate was dipped in an electroless gold plating solution comprising

| | |
|---|---|
| potassium cyanoaurate | 2 g/liter |
| ammonium chloride | 75 g/liter |
| sodium citrate | 50 g/liter |
| sodium hypophosphite | 10 g/liter | with pH 7.0–7.5 at 92° C. for 30 minutes to form plated layers of about 0.5 μm thick. After electroless nickel plating, a photoresist film for electroless plating made of ultraviolet curable acrylic resin (Photec SR-3000, a trade name, mfd. by Hitachi Chemical Co., Ltd.) was laminated on the resulting substrate using a vacuum laminator, followed by exposing to light and development to form a second resist on the nickel circuit 5 to 10 μm narrower than the first resist.

After washing with water, the substrate was dipped in the same electroless copper plating solution as used in Example 1 at 70° C. to form copper plated layers of about 20 μm thick on the plated layers. A solder resist was screen printed on both surfaces of the resulting substrate except for the through-holes and cured with heating to give a sample of printed wiring board.

COMPARATIVE EXAMPLE 9

The process of Example 12 was repeated except for not conducting the electroless nickel/tungsten alloy plating to give a sample of printed wiring board.

COMPARATIVE EXAMPLE 10

The process of Example 13 was repeated except for not conducting the electroless cobalt/nickel alloy plating to give a sample of printed wiring board.

In the above-mentioned samples of Examples 12 to 16 and Comparative Examples 9 and 10, both the conductor width and the space between conductors were made 0.1 mm, the through-hole diameter was made 0.6 mm, and the number of through-holes was made 200. Conductor patterns were made in the same manner as described in Examples 1 to 3.

Electrolytic corrosion (EC) between conductors, and between through-holes (generation of dendrite), solder heat resistance and peeling strength were measured in the same manner as described in Examples 1 to 3.

The results are shown in Table 3.

TABLE 3

| | Examples | | | | | Comparative Examples | |
|---|---|---|---|---|---|---|---|
| | 12 | 13 | 14 | 15 | 16 | 9 | 10 |
| EC between electrodes | | | | | | | |
| after 100 hrs | No change | No change | No change | No change | No change | Resistance value was reduced by 50% | No change |
| after 300 hrs | No change | No change | No change | No change | No change | Short-circuited | Short-circuited |
| EC between through-holes after 300 hrs | No change | No change | No change | No change | No change | Migration of copper | Migration of copper |
| Solder heat resistance (260° C.) | ≧60 sec. | ≧60 sec. | ≧60 sec. | ≧60 sec. | ≧60 sec. | ≧60 sec. | ≧60 sec. |
| Peeling strength (kgf/cm) | 2.1 | 2.1 | 2.1 | 1.8 | 1.9 | 2.0 | 2.1 |

As is clear from Table 3, both the electrolytic corrosion between conductors and between through-holes are improved remarkably, while maintaining good solder heat resistance and peeling strength.

EXAMPLE 17

Using the wiring board obtained in Example 1, the test was carried out under a relative humidity of 85%, a temperature of 85° C., and application of direct current of 100 V.

For comparison, a wiring board having a cross-sectional structure as shown in FIG. 2, wherein only one thick resist layer 8 is used in contact with a nickel layer 3 and a copper layer 4 at the boundary 10, was also subjected to the same test.

Using 500 samples, lowering of insulating resistance was measured and listed in the following Table 4.

TABLE 4

| Example No. | Test hours (hrs) | Number of samples lowering the insulating resistance | | |
|---|---|---|---|---|
| | | >1 × $10^{10}$ ohm | >1 × $10^9$ ohm | short circuited |
| Example 17 | 100 | 0 | 0 | 0 |
| | 200 | 0 | 0 | 0 |
| | 500 | 0 | 0 | 0 |
| | 1000 | 0 | 0 | 0 |
| (Comparison) | 100 | 0 | 0 | 0 |
| | 200 | 1 | 0 | 0 |
| | 500 | 0 | 0 | 0 |
| | 1000 | 5 | 6 | 2 |

What is claimed is:
1. A process for producing a printed wiring board, which comprises
(i-a) forming an adhesive layer containing an electroless plating catalyst on surfaces of an insulating substrate containing an electroless plating catalyst,
(ii-b) drilling through-holes in the resulting insulating substrate,
(iii-c) masking portions except for the through-holes and circuit forming portions with a first resist for electroless plating,

(iv-d) dipping the resulting substrate in a chemical roughening solution to selectively roughen the portions not masked with the resist, (v-e) dipping the thus treated substrate in an electroless nickel plating solution to form nickel plated layers on the roughened portions not masked with the first resist, (v-ef) masking portions except for the through-holes and circuit forming portions with a second resist for electroless plating, the second resist forming a circuit forming pattern that is 5 to 10 $\mu$m narrower than that of the first resist, so that the second resist covers a portion of the nickel plated layers, and (vi-f) dipping the nickel plated substrate in an electroless copper plating solution to conduct copper plating on exposed portions of the nickel plated layers.

2. A process according to claim 1, wherein the nickel-plated layer has a thickness of 0.5 to 10 $\mu$m.

3. A process according to claim 1, wherein in (v-ef) the second resist overlaps a boundary between the first resist and the nickel plated layers and subsequently in (vi-f) a copper circuit is formed having a boundary with the second resist that is located over the nickel plated layers.

4. A process for producing a printed wiring board, which comprises (i-a') forming an adhesive layer on surfaces of an insulating substrate, (ii-b) drilling through-holes in the resulting insulating substrate, (iii-d') dipping the resulting substrate in a chemical roughening solution to roughen the whole surfaces, (iv-d) masking portions except for the through-holes and circuit forming portions with a first resist for electroless plating, (v-e) dipping the thus treated substrate in an electroless nickel plating solution to form nickel plated layers on the roughened portions not masked with the first resist, (v-ef) masking portions except for the through-holes and circuit forming portions with a second resist for electroless plating, the second resist forming a circuit forming pattern that is 5 to 10 $\mu$m narrower than that of the first resist, so that the second resist covers a portion of the nickel plated layers, and (vi-f) dipping the nickel plated substrate in an electroless copper plating solution to conduct copper plating on exposed portions of the nickel plated layers.

5. A process according to claim 4, wherein the nickel plated layer has a thickness of 0.5 to 10 $\mu$m.

6. A process for producing a printed wiring board, which comprises (i-a) forming an adhesive layer of surfaces of an insulating substrate, (ii-b) drilling through-holes in the resulting insulating substrate, (iii-c) masking portions except for the through-holes and circuit forming portions with a first resist for electroless plating, (iv-d) dipping the resulting substrate in a chemical roughening solution to selectively roughen the portions not masked with the first resist, (v-H) dipping the resulting substrate in an aqueous solution containing palladium ions, (v-i) dipping the resulting substrate in a reducing agent solution, (vii-e) dipping the thus treated substrate in an electroless plating solution to form nickel plated layers on the roughened portions not masked with the first resist, (v-ef) masking portions except for the through-holes and circuit forming portions with a second resist for electroless plating, the second resist forming a circuit forming pattern that is 5 to 10 $\mu$m narrower than that of the first resist, so that the second resist covers a portion of the nickel plated layers, and (viii-f) dipping the nickel plated substrate in an electroless copper plating solution to conduct copper plating on exposed portions of the nickel plated layers.

7. A process according to claim 6, wherein the aqueous solution contains palladium ions in a concentration of 0.01 to 0.6% by weight.

8. A process according to claim 6, wherein in (v-ef) the second resist overlaps a boundary between the first resist and the nickel plated layers and subsequently in (viii-f) a copper circuit is formed having a boundary with the second resist that is located over the nickel plated layers.

9. A process for producing a printed wiring board, which comprises (i-a) forming an adhesive layer containing an electroless plating catalyst on surfaces of an insulating substrate containing an electroless plating catalyst, (ii-b) drilling through-holes in the resulting insulating substrate, (iii-c) masking portions except for the through-holes and circuit forming portions with a first resist for electroless plating, (iv-d) dipping the resulting substrate in a chemical roughening solution to selectively roughen the portions not masked with the first resist, (v-e) dipping the thus treated substrate in an electroless plating solution to form plated layers of nickel, a nickel alloy, or a mixture thereof on the roughened portions not masked with the first resist, (v-ef) masking portions except for the through-holes and circuit forming portions with a second resist for electroless plating, the second resist forming a circuit forming pattern that is 5 to 10 $\mu$m narrower than that of the first resist, so that the second resist covers a portion of the nickel plated layers, and (vi-f) dipping the thus nickel plated substrate in an electroless copper plating solution to conduct copper plating on exposed portions of the nickel plated layers.

* * * * *